United States Patent
Kim et al.

(10) Patent No.: US 8,968,969 B2
(45) Date of Patent: Mar. 3, 2015

(54) REFLECTIVE EXTREME ULTRAVIOLET MASK AND METHOD OF MANUFACTURING THE SAME

(75) Inventors: Tae-Geun Kim, Seoul (KR); Dong-Wan Kim, Seongnam-si (KR); Dong-Gun Lee, Hwaseong-si (KR); Seong-Sue Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 376 days.

(21) Appl. No.: 13/302,143

(22) Filed: Nov. 22, 2011

(65) Prior Publication Data
US 2012/0135339 A1 May 31, 2012

(30) Foreign Application Priority Data
Nov. 29, 2010 (KR) .................. 10-2010-0119409

(51) Int. Cl.
*G03F 1/24* (2012.01)
*G03F 1/38* (2012.01)

(52) U.S. Cl.
CPC ... *G03F 1/24* (2013.01); *G03F 1/38* (2013.01)
USPC ............................................. 430/5

(58) Field of Classification Search
CPC ...................................... G03F 1/24
USPC ............................................. 430/5
See application file for complete search history.

(56) References Cited

U.S. PATENT DOCUMENTS

| 7,073,969 | B2 | 7/2006 | Kamm | |
| 8,568,944 | B2 * | 10/2013 | Kim et al. | 430/5 |
| 2004/0131947 | A1 | 7/2004 | Fisch Gallagher et al. | |
| 2004/0198047 | A1 * | 10/2004 | Kamm | 438/689 |
| 2008/0131790 | A1 * | 6/2008 | Chang et al. | 430/5 |
| 2009/0029268 | A1 * | 1/2009 | Lin et al. | 430/5 |
| 2009/0111034 | A1 | 4/2009 | Kim | |
| 2009/0148781 | A1 * | 6/2009 | Kamo et al. | 430/5 |

* cited by examiner

*Primary Examiner* — Christopher Young
(74) *Attorney, Agent, or Firm* — Lee & Morse, P.C.

(57) ABSTRACT

A reflective extreme ultraviolet mask includes a mask substrate having an exposing region and a peripheral region, the mask substrate including a light-scattering portion in the peripheral region, a reflective layer on an upper surface of the mask substrate, the reflective layer having a first opening exposing the light-scattering portion, and an absorbing layer pattern on the reflective layer, the absorbing layer pattern having a second opening in light communication with the first opening.

9 Claims, 5 Drawing Sheets

PERIPHERAL REGION | EXPOSING REGION | PERIPHERAL REGION

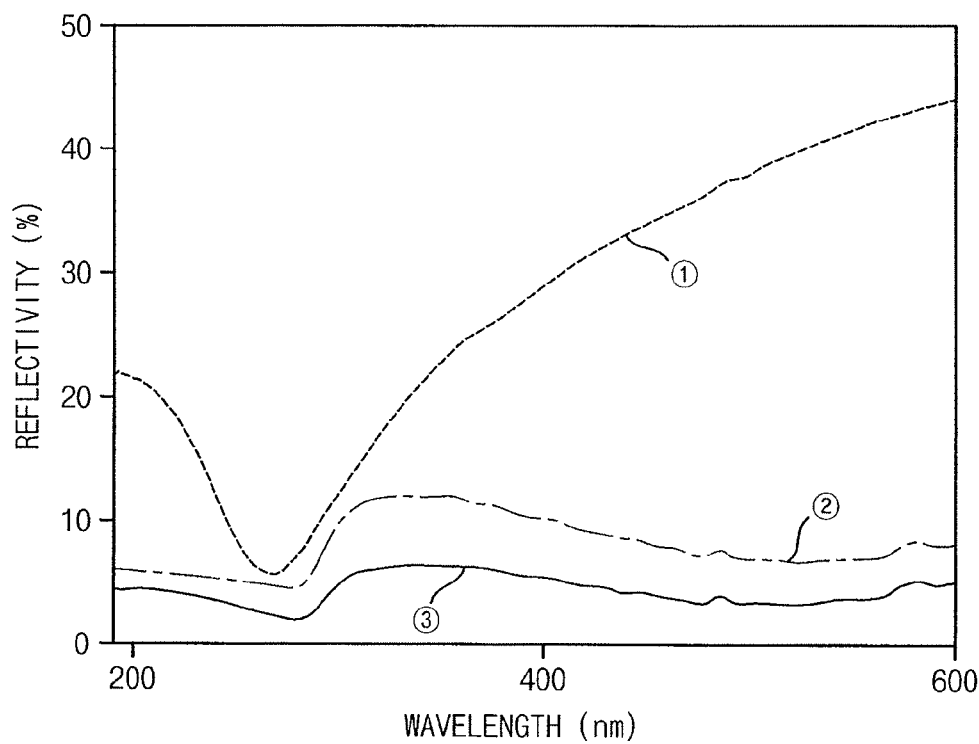

REFLECTIVE EXTREME ULTRAVIOLET MASK AND METHOD OF MANUFACTURING THE SAME

REFERENCE TO CROSS-RELATED APPLICATION

Korean Patent Application No. 10-2010-0119409, filed on Nov. 29, 2010, in the Korean Intellectual Property Office, and entitled: "Reflective Extreme Ultraviolet Mask and Method of Manufacturing the Same," is incorporated by reference herein in its entirety.

BACKGROUND

1. Field

Example embodiments relate to a reflective extreme ultraviolet mask and a method of manufacturing the same. More particularly, example embodiments relate to a reflective ultraviolet mask having a reflective layer, and a method of manufacturing the reflective extreme ultraviolet mask.

2. Description of the Related Art

As a design rule of a semiconductor device is reduced, a wavelength of light used in an exposing process is reduced as well. Thus, a minute pattern may not be formed using light such as an I-line, a G-line, a KrF, an ArF, or the like. Therefore, an extreme ultraviolet (EUV) light having a short wavelength may be used in the exposing process.

As a large amount of the EUV light may be absorbed in an absorbing layer of an EUV mask, i.e., due to high energy of the light, most of the EUV light may not reach a semiconductor substrate. To overcome this drawback, a reflective EUV mask capable of using a reflected EUV may be used. For example, the reflective EUV mask may include a mask substrate, a reflective layer on the mask substrate, and an absorbing layer pattern on the reflective layer.

SUMMARY

Example embodiments may include a reflective extreme ultraviolet (EUV) mask, including a mask substrate having an exposing region and a peripheral region, the mask substrate including a light-scattering portion in the peripheral region, a reflective layer on an upper surface of the mask substrate, the reflective layer having a first opening exposing the light-scattering portion, and an absorbing layer pattern on the reflective layer, the absorbing layer pattern having a second opening in fluid communication with the first opening.

The light-scattering portion may have a grating structure on the upper surface of the mask substrate.

The absorbing layer pattern may include an EUV absorbing layer pattern on an upper surface of the reflective layer, and a deep ultraviolet (DUV) absorbing layer pattern on an upper surface of the EUV absorbing layer pattern.

The absorbing layer pattern in the exposing region may include an exposing pattern.

Example embodiments may also include a method of manufacturing a reflective EUV mask, the method including forming a light-scattering portion in a peripheral region of a mask substrate, the mask substrate having an exposing region and the peripheral region, forming a reflective layer on an upper surface of the mask substrate, the reflective layer having a first opening exposing the light-scattering portion, and forming an absorbing layer pattern on the reflective layer, the absorbing layer pattern having a second opening in fluid communication with the first opening.

The method may further include forming an absorbing layer on the reflective layer, etching the reflective layer to form the first opening, etching the absorbing layer to form the absorbing layer pattern with the second opening, and etching the upper surface of the mask substrate exposed through the first opening and the second opening to form the light-scattering portion on the upper surface of the mask substrate.

Forming the absorbing layer may include forming an EUV absorbing layer on an upper surface of the reflective layer, and forming a deep ultraviolet (DUV) absorbing layer on an upper surface of the EUV absorbing layer.

Forming the absorbing layer pattern may include etching the absorbing layer in the exposing region to form an exposing pattern.

Forming the exposing pattern and the second opening may be performed simultaneously.

The mask substrate, the reflective layer, and the absorbing layer may be etched by a plasma etching process.

The light-scattering portion may include etching the upper surface of the mask substrate.

Forming the absorbing layer pattern may include forming an EUV absorbing layer on the reflective layer, forming a DUV absorbing layer on an upper surface of the EUV absorbing layer, and etching the DUV absorbing layer and the EUV absorbing layer to form the second opening.

Forming the absorbing layer pattern may further include etching the EUV absorbing layer and the DUV absorbing layer in the exposing region to form an exposing pattern.

Forming the exposing pattern and the second opening may be performed simultaneously.

Forming the first and second openings may be performed simultaneously.

Example embodiments may also include a reflective EUV mask, including a mask substrate having an exposing region and a peripheral region, a reflective layer on the mask substrate, an absorbing layer pattern on the reflective layer, a light-scattering portion in the peripheral region of the mask substrate, a tunnel structure through the reflective layer and the absorbing layer exposing the light scattering portion on the mask substrate.

The reflective layer and the absorbing layer may include respective first and second openings in fluid communication with each other, the first and second openings defining the tunnel structure.

The light-scattering portion may be directly on an upper surface of the mask substrate, the light-scattering portion extending along an entire bottom of the first opening.

Widths of the light-scattering portion, the first opening, and the second opening may substantially equal each other.

The light scattering portion may surround the exposing region.

BRIEF DESCRIPTION OF THE DRAWINGS

The above and other features and advantages will become more apparent to those of ordinary skill in the art by describing in detail exemplary embodiments with reference to the attached drawings, in which:

FIG. 11 illustrates a graph showing reflectivities of a reflective EUV mask according to example embodiments and conventional reflective EUV masks.

DETAILED DESCRIPTION

Figure 1:
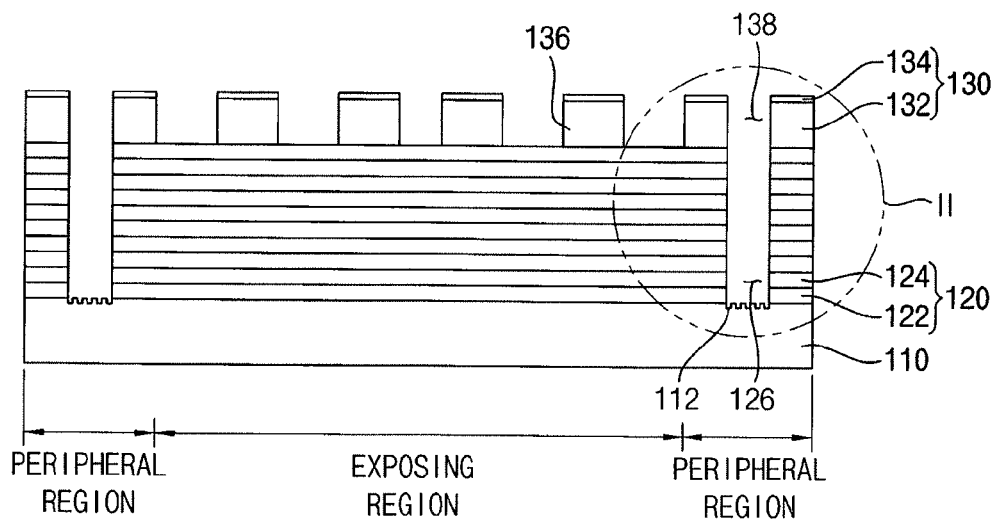
FIG. 1 illustrates a cross-sectional view of a reflective EUV mask according to example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when an element, e.g., a layer, or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Further, when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "adjacent" versus "directly adjacent", etc.). Like reference numerals refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Reflective EUV Mask

Figure 2:
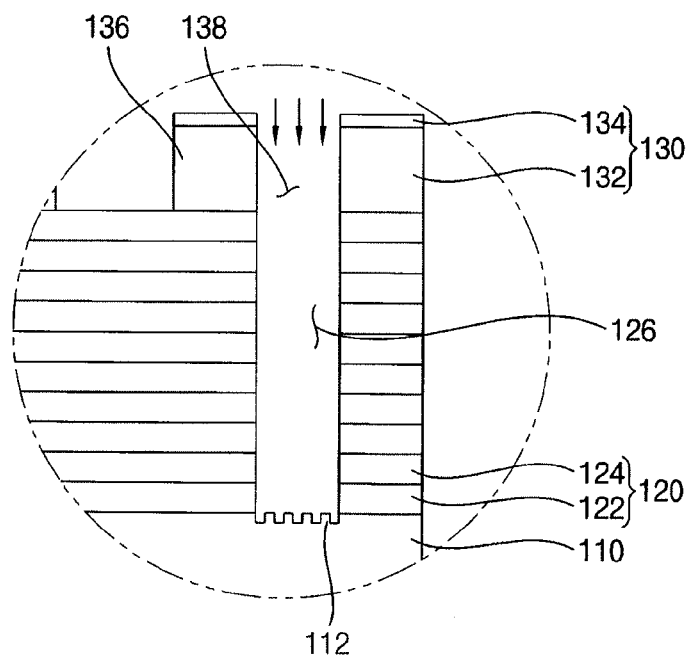
FIG. 2 illustrates an enlarged cross-sectional view of portion "II" in FIG. 1.
Figure 3:
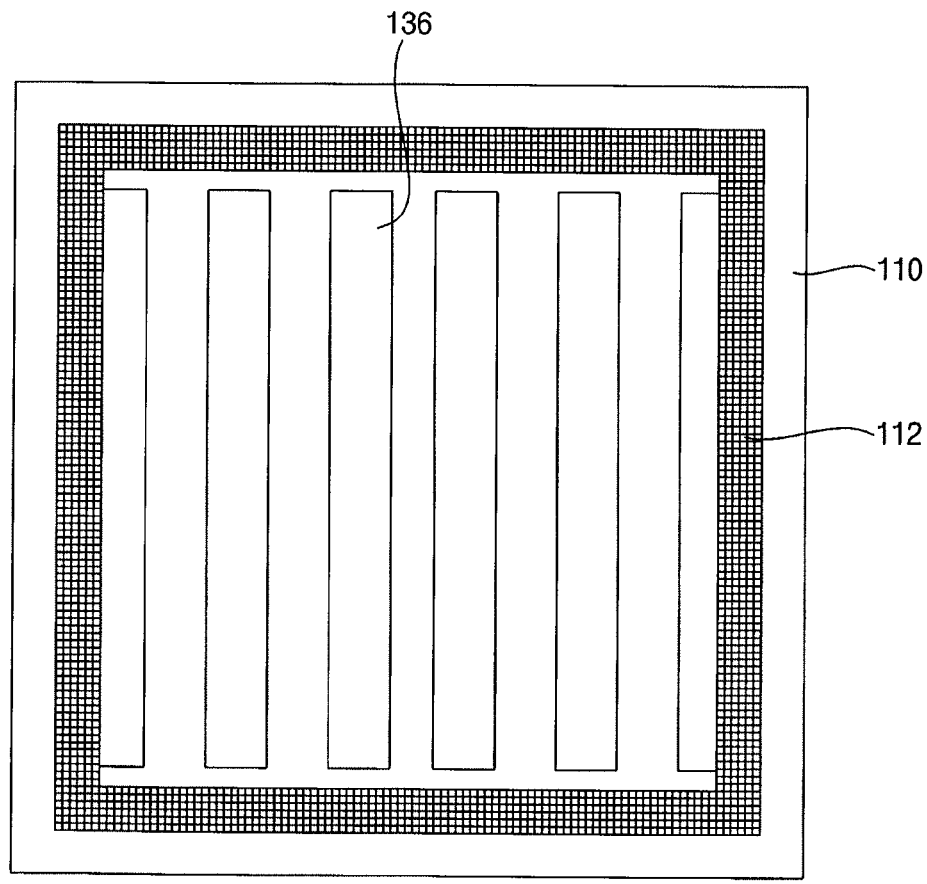
FIG. 3 illustrates a plan view of the reflective EUV mask in FIG. 1.

FIG. 1 is a cross-sectional view of a reflective EUV mask according to example embodiments, FIG. 2 is an enlarged cross-sectional view of portion "II" in FIG. 1, and FIG. 3 is a plan view of the reflective EUV mask in FIG. 1.

Referring to FIGS. 1 to 3, a reflective EUV mask 100 according to example embodiments may include a mask substrate 110, a reflective layer 120, and an absorbing layer pattern 130.

As illustrated in FIG. 1, the mask substrate 110 may include an exposing region and a peripheral region. In some example embodiments, the mask substrate 110 may have a rectangular shape. The exposing region may be located at a central portion of the mask substrate 110. The peripheral region may be located at an edge portion of the mask substrate 110 to surround, e.g., completely surround an entire perimeter of, the patterned region. The peripheral region may correspond to a non-patterned region that is not used in an exposing process.

In order to decrease reflectivity of EUV light and reflectivity of deep ultraviolet (DUV) light from the mask substrate 110, the mask substrate 110 may have a light-scattering portion 112 for scattering the EUV light and the DUV light. In some example embodiments, the light-scattering portion 112 may be formed on, e.g., directly on, an upper surface of the mask substrate 110 in the peripheral region. The light-scattering portion 112 may have a grating structure. For example, as illustrated in FIG. 3, the light-scattering portion 112 may be formed only in the peripheral region of the mask substrate 110, and may surround, e.g., completely surround an entire perimeter of, the exposing region of the mask substrate 110. The EUV light and the DUV light incident on the upper surface of the mask substrate 110, i.e., on the light-scattering portion 112, may be scattered, so that the EUV light and the DUV light may not interfere with EUV light reflected from the reflective layer 120 in the exposing region.

In example embodiments, the reflective layer 120 may be arranged on the upper surface of the mask substrate 110. The reflective layer 120 may include molybdenum layers 122 and silicon layers 124 alternately stacked. The reflective layer 120 may reflect EUV light irradiated on the EUV mask 100 in an exposing process.

In some example embodiments, the reflective layer 120 may have a first opening 126 configured to expose the light-scattering portion 112. The first opening 126 may be formed through a portion of the reflective layer 120 in the peripheral region.

The absorbing layer pattern 130 may be arranged on the reflective layer 120. The absorbing layer pattern 130 may include a plurality of exposing patterns 136 with openings therebetween, e.g., the exposing patterns 136 may be spaced apart from each other along a first direction and surrounded by the light-scattering portion 112. The openings may partially expose the upper surface of the reflective layer 120 in the exposing region. Thus, EUV light irradiated toward the reflective EUV mask 100 may be incident on the reflective layer 120 through the openings of the absorbing layer pattern 130.

In some example embodiments, the absorbing layer pattern 130 may include an EUV absorbing layer pattern 132 formed on the upper surface of the reflective layer 120, and a DUV absorbing layer pattern 134 formed on an upper surface of the EUV absorbing layer pattern 132. The absorbing layer pattern 130 may have a second opening 138 in fluid communication with the first opening 126 of the reflective layer 120. For example, the first and second openings 126 and 138 may completely overlap each other to form a single tunnel structure, e.g., with a uniform width, that exposes the light-scattering portion 112 at a bottom thereof. Thus, the light-scattering portion 112 may be exposed through the first opening 126 and the second opening 138.

In some example embodiments, the first opening 126 and the second opening 138 may be formed by separate processes. Alternatively, the first opening 126 and the second opening 138 may be simultaneously formed by a single plasma etching process on the reflective layer 120 and the absorbing layer pattern 130.

According to an example embodiment, the light-scattering portion may be formed on the mask substrate, and may be exposed through openings of the reflective layer and the absorbing layer. As such, light incident on the light-scattering portion may be scattered, thereby reducing reflectivity of the mask substrate. Thus, a desired photoresist pattern may be accurately formed using the reflective EUV mask.

Method of Manufacturing a Reflective EUV Mask

FIGS. 4 to 8 are cross-sectional views of stages in a method of manufacturing the reflective EUV mask 100 in FIG. 1.

Figure 4:
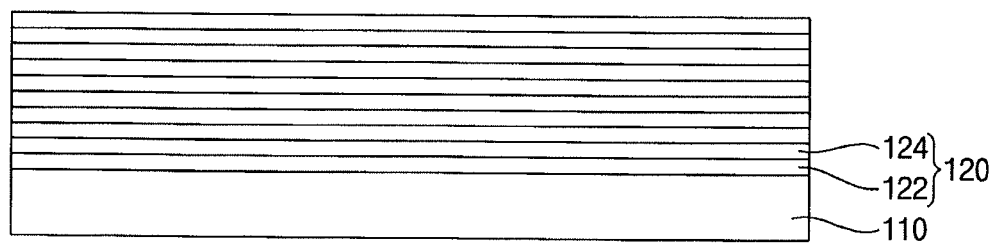
FIGS. 4 to 8 illustrate cross-sectional views of stages in a method of manufacturing a reflective EUV mask according to example embodiments.

Referring to FIG. 4, the reflective layer 120 may be formed on the upper surface of the mask substrate 110. In example embodiments, the mask substrate 110 may have the exposing region and the peripheral region. The exposing region may be located at a central portion of the mask substrate 110. The peripheral region may be located at an edge portion of the mask substrate 110 to surround the exposing region.

For example, the reflective layer 120 may include molybdenum layers 122 and silicon layers 124 alternately stacked. In another example, the reflective layer 120 may include other suitable layers in place of the molybdenum layers 122 and/or the silicon layers 124.

Figure 5:
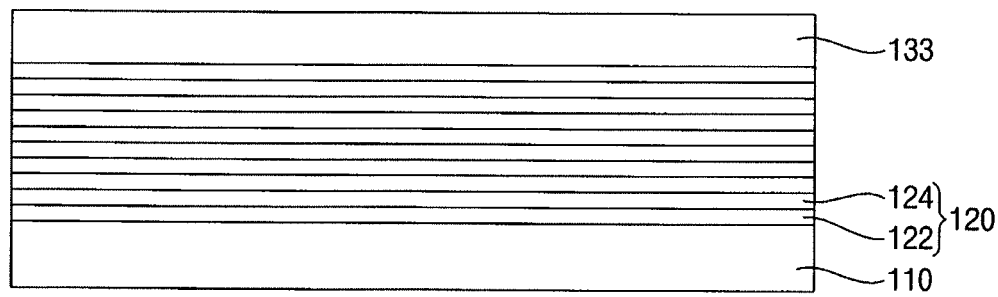

Referring to FIG. 5, an EUV absorbing layer 133 may be formed on the upper surface of the reflective layer 120. That is, the reflective layer 120 may be between the mask substrate 110 and the EUV absorbing layer 133.

Figure 6:
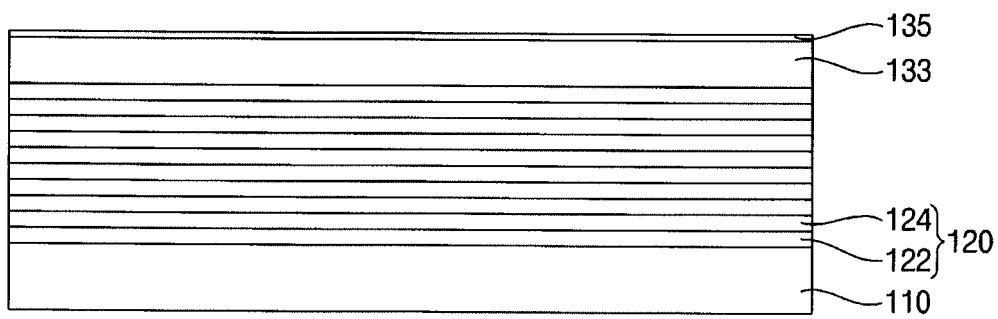

Referring to FIG. 6, a DUV absorbing layer 135 may be formed on an upper surface of the EUV absorbing layer 133. That is, the EUV absorbing layer 133 may be between the reflective layer 120 and the DUV absorbing layer 135.

Figure 7:
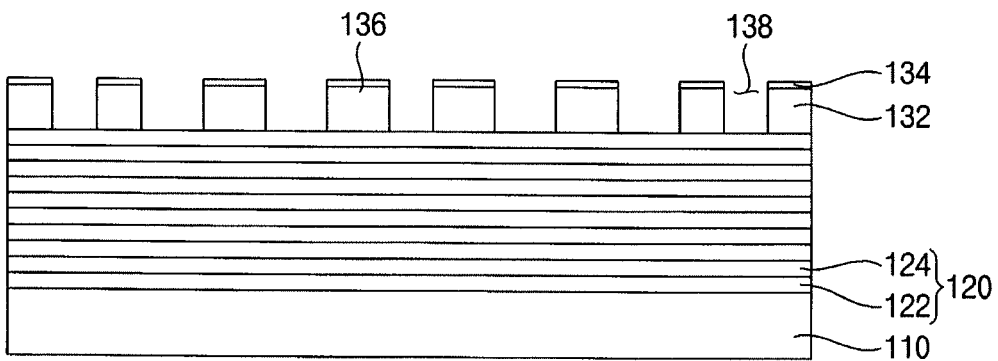

Referring to FIG. 7, the DUV absorbing layer 135 and the EUV absorbing layer 133 may be etched to form the DUV absorbing layer pattern 134 and the EUV absorbing layer pattern 132, respectively. In some example embodiments, the EUV absorbing layer pattern 132 and the DUV absorbing layer pattern 132 may be formed on the entire substrate mask 110, e.g., in the exposing region and in the peripheral region, to define the exposing pattern 136. Further, the EUV absorbing layer pattern 132 and the DUV absorbing layer pattern 134 in the peripheral region may have the second opening 138 configured to expose the upper surface of the reflective layer 120. The DUV absorbing layer pattern 134 and the EUV absorbing layer pattern 132 may be formed by a plasma etching process.

Figure 8:
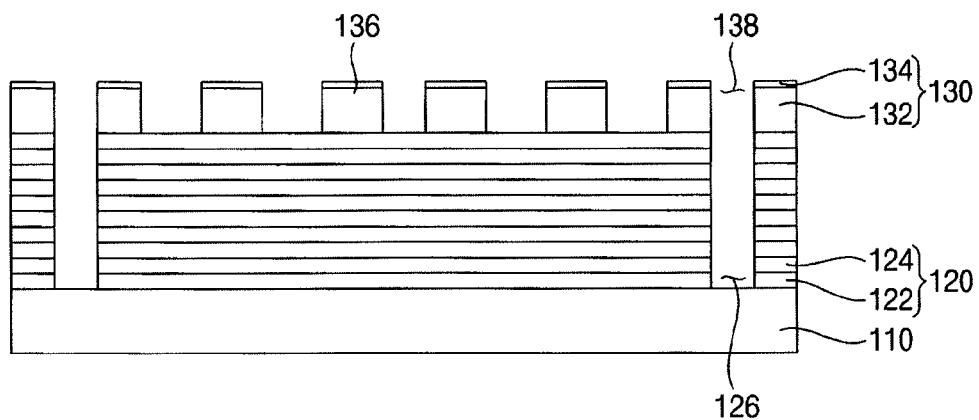

Referring to FIG. 8, the upper surface of the reflective layer 120 exposed through the second opening 138 may be etched to form the first opening 126, such the second opening 138 and the first opening 126 may be in fluid communication. Thus, the upper surface of the mask substrate 110 in the peripheral region may be exposed through the first opening 126 and the second opening 138. In some example embodiments, the first opening 126 may be formed by a plasma etching process.

Referring back to FIG. 1, the upper surface of the mask substrate 110 exposed through the first opening 126 and the second opening 138 may be etched to form the light-scattering portion 112, thereby completing the reflective EUV mask 100. For example, widths of the first opening 126, second opening 138, and light-scattering portion 112 may substantially equal each other along the first direction.

Figure 9:
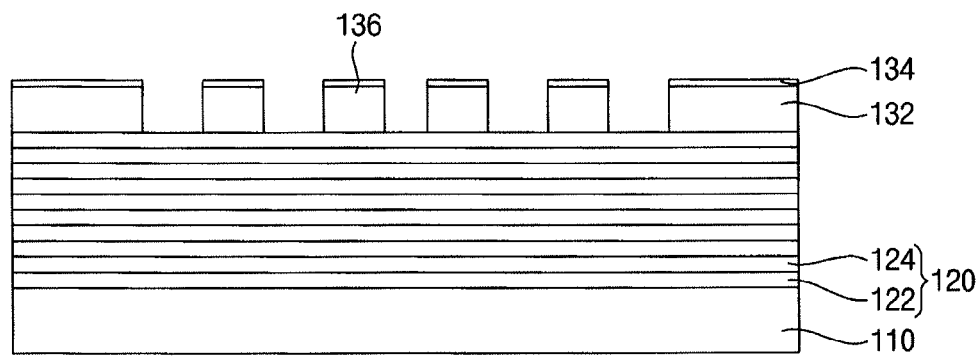
FIGS. 9 and 10 illustrate cross-sectional views of stages in a method of manufacturing the reflective EUV mask according to other example embodiments.
Figure 10:
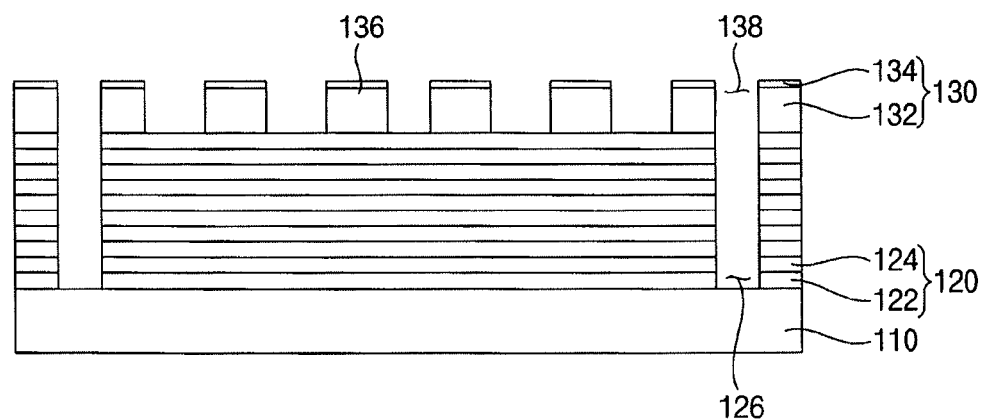

FIGS. 9 and 10 are cross-sectional views illustrating a method of manufacturing the reflective EUV mask 100 according to other embodiments.

Processes substantially the same as those illustrated with reference to FIGS. 4 to 6 may be performed to form the reflective layer 120, the EUV absorbing layer 133, and the DUV absorbing layer 135 on the upper surface of the mask substrate 110.

Referring to FIG. 9, the EUV absorbing layer 133 and the DUV absorbing layer 135 in the exposing region may be etched to form the exposing pattern 136. That is, the exposing pattern in FIG. 9 may be formed only in the exposing region, so portions of the EUV absorbing layer 133 and the DUV absorbing layer 135 in the peripheral region may remain unetched. In some example embodiments, the exposing pattern 136 may be formed by a plasma etching process.

Referring to FIG. 10, portions of the EUV absorbing layer 133 and the DUV absorbing layer 135 in the peripheral region may be etched by a single etching process to form the EUV absorbing layer pattern 132 and the DUV absorbing layer pattern 134 having the second opening 138. Simultaneously, the first opening 126 may be formed through the reflective layer 120 to be in fluid communication with the second opening 138. The first opening 126 and the second opening 138 may be formed simultaneously by a plasma etching process.

The upper surface of the mask substrate 110 exposed through the first opening 126 and the second opening 138 may be etched to form the light-scattering portion 112, thereby completing the reflective EUV mask 100.

Measuring Reflectivities of Reflective EUV Mask

Light may be irradiated onto a first reflective EUV mask, i.e., a mask without openings, onto a second reflective EUV mask, i.e., a mask having at least one opening without a light-scattering portion, and onto a third reflective EU mask, i.e., the reflective EUV mask 100 in FIG. 1. Reflectivity of each of the first through third reflective EUV masks was measured.

FIG. 11 is a graph showing reflectivities of the first through third reflective EUV masks. In FIG. 11, a curved line ①represents the reflectivity of the first reflective EUV mask, a curved line ② represents the reflectivity of the second reflective EUV mask, and a curved line ③ represents the reflectivity of the third reflective EUV mask.

As shown in FIG. 11, it can be noted that the reflectivity of the second reflective EUV mask was lower than that of the first reflective EUV mask. Further, the reflectivity of the third reflective EUV mask was lower than that of the second reflective EUV mask. Thus, it can be noted that the light-scattering portion of the reflective EUV mask 100 may greatly decrease light reflectivity.

According to example embodiments, the light-scattering portion may be formed on the mask substrate exposed through the openings of the reflective layer and the absorbing layer to decrease reflectivity of the mask substrate. Thus, a desired photoresist pattern may be accurately formed using the mask. As a result, a desired pattern may be precisely formed using the desired photoresist pattern.

In contrast, in a conventional reflective EUV mask, e.g., i.e., a mask without a light-scattering portion, EUV light reflected from the peripheral region, i.e., a portion of the reflective layer under the edge region of the absorbing layer pattern, may interfere with EUV and/or DUV light reflected from the exposing region, i.e., a portion of the reflective layer under a patterned region of the absorbing layer pattern. Such light interference may reduce patterning precision, e.g., a desired photoresist pattern may not be accurately formed, thereby reducing produce quality and operability. Therefore, it may be required to decrease a reflectivity of the portion of the reflective layer under the edge region of the absorbing layer pattern.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A reflective extreme ultraviolet (EUV) mask, comprising:
   a mask substrate having an exposing region with a patterned region and a peripheral region with a non-patterned region, the mask substrate including a light-scattering portion in the peripheral region, and the light-scattering portion scattering both EUV light and deep ultraviolet (DUV) light;
   a reflective layer on an upper surface of the mask substrate, the reflective layer having a first opening exposing the light-scattering portion; and
   an absorbing layer pattern on the reflective layer, the absorbing layer pattern having a second opening in light communication with the first opening.

2. The reflective EUV mask as claimed in claim 1, wherein the light-scattering portion has a grating structure on the upper surface of the mask substrate.

3. The reflective EUV mask as claimed in claim 1, wherein the absorbing layer pattern includes:
   an EUV absorbing layer pattern on an upper surface of the reflective layer; and
   a deep ultraviolet (DUV) absorbing layer pattern on an upper surface of the EUV absorbing layer pattern.

4. The reflective EUV mask as claimed in claim 1, wherein the absorbing layer pattern in the exposing region includes an exposing pattern.

5. A reflective extreme ultraviolet (EUV) mask, comprising:
   a mask substrate having an exposing region with a patterned region and a peripheral region with a non-patterned region;
   a reflective layer on the mask substrate;
   an absorbing layer pattern on the reflective layer; and
   a light-scattering portion in the peripheral region of the mask substrate to scatter both EUV light and deep ultraviolet (DUV) light, a tunnel structure through the reflective layer and the absorbing layer pattern exposing the light scattering portion on the mask substrate.

6. The reflective EUV mask as claimed in claim 5, wherein the reflective layer and the absorbing layer pattern include respective first and second openings in light communication with each other, and wherein the first and second openings define the tunnel structure.

7. The reflective EUV mask as claimed in claim 6, wherein the light-scattering portion is directly on an upper surface of the mask substrate, and wherein the light-scattering portion extends along an entire bottom of the first opening.

8. The reflective EUV mask as claimed in claim 6, wherein widths of the light-scattering portion, the first opening, and the second opening are substantially equal to each other.

9. The reflective EUV mask as claimed in claim 5, wherein the light scattering portion surrounds the exposing region.

* * * * *